United States Patent [19]

Higginbotham

[11] Patent Number: 4,698,120
[45] Date of Patent: Oct. 6, 1987

[54] BARRIER FOR QUARTZ CRUCIBLE FOR DRAWING SILICON DENDRITIC WEB AND METHOD OF USE

[75] Inventor: William C. Higginbotham, North Huntingdon, Pa.

[73] Assignee: Westinghouse Electric Corp., Pittsburgh, Pa.

[21] Appl. No.: 823,823

[22] Filed: Jan. 28, 1986

Related U.S. Application Data

[63] Continuation of Ser. No. 666,066, Oct. 29, 1984, abandoned.

[51] Int. Cl.[4] .................. H01L 21/20; H01L 21/208; B01D 9/00
[52] U.S. Cl. .............................. 156/608; 156/617 H; 422/248
[58] Field of Search ............... 422/248, 246; 156/608, 156/617 H, 617 S P, DIG. 85, DIG. 84, DIG. 98

[56] References Cited

U.S. PATENT DOCUMENTS

| | | | |
|---|---|---|---|
| 3,933,981 | 1/1976 | Wakefield et al. | 422/249 |
| 4,036,595 | 7/1977 | Lorenzini et al. | 422/249 |
| 4,190,631 | 2/1980 | Dewees et al. | 422/249 |
| 4,203,951 | 5/1980 | Goriletsky et al. | 422/249 |
| 4,289,571 | 9/1981 | Jewett | 156/617 H |
| 4,334,948 | 6/1982 | Berkman et al. | 156/604 |
| 4,352,784 | 10/1982 | Lin | 422/249 |
| 4,389,377 | 6/1983 | Duncan et al. | 156/DIG. 84 |

Primary Examiner—S. Leon Bashore
Assistant Examiner—Michael K. Boyer
Attorney, Agent, or Firm—D. M. Satina

[57] ABSTRACT

Improved quartz barrier means for drawing dendritic silicon web from a silicon melt forms within the quartz crucible a silicon melt replenishment section and a web drawing section. To permit the molten silicon to flow from the melt replenishment section into the web drawing section, aperture means are provided in the form of cut-out sections in the lateral edges of the barrier means. The position of the aperture means above the bottom of the crucible insures an adequate pool of molten silicon to flow into the web drawing section. The position of the aperture means beneath the top level of the molten silicon insures that no unmelted silicon floating on the top of silicon in the replenishment section passes into the web drawing section. The position of the apertures next to the heated side walls of the crucible insure that the melted silicon is heated to an optimum temperature upon passing into the web drawing section.

10 Claims, 12 Drawing Figures

BARRIER FOR QUARTZ CRUCIBLE FOR DRAWING SILICON DENDRITIC WEB AND METHOD OF USE

This application is a continuation of application Ser. No. 666,066 filed Oct. 29, 1984 now abandoned.

BACKGROUND OF THE INVENTION

This invention relates generally to apparatus for growing silicon dendritic web from a melt and, more particularly, to an improved barrier for use in a quartz crucible melt system which enables continuous replacement of the melt.

In the growth of silicon dendritic web in a melt system including an inductively heated susceptor which contains a crucible, melt replenishment has received considerable attention as a means of decreasing costs and improving crystal quality. In such a system, particles or pellets are added at one or both ends of the crucible as the web crystals are grown; however, the heat absorbed in the regions where melting of the replenishment material takes place creates a significant thermal unbalance in the region from which the web is drawn.

The ideal thermal situation would be one that would have a hot region where the pellets are added with the remainder of the crucible being unaffected by additions of material. One approach known to those skilled in the art is the use of one or more barriers within the crucible to localize relatively hot melt replenishment regions from the region from which the dendritic web is drawn. Additionally, various types of thermal modifications have been made by varying the shielding or by moving the induction heating coil; however, these changes tend to provide a linear temperature gradient between the melt region and the growth region which is accompanied by undesirable crystal characteristics. Also, flow of molten silicon from the melt replenishment regions through the barrier disturbs the melt in the growth compartment.

SUMMARY OF THE INVENTION

There is provided an improved quartz barrier means for use with an apparatus for drawing dendritic silicon web from a silicon melt. The conventional apparatus comprises an elongated quartz crucible having a closed bottom and side members extending upwardly therefrom with the top portion of the crucible being at least partially open. Quartz barrier means are laterally disposed within the crucible to define therein a silicon melt replenishment section or sections and a separate dendritic web drawing section. Heating means heat the bottom and side portions of the crucible to melt silicon therein and to retain a predetermined level of silicon in the molten state in the web drawing section in the crucible. There is provided means for drawing dendritic silicon web at a predetermined rate from the molten surface of the silicon contained within the web drawing section of the crucible. There is also provided silicon replenishment means for adding unmelted silicon at a predetermined rate to the silicon melt replenishment section.

In accordance with the present invention, there is provided an improved quartz barrier which has a predetermined configuration comprising a bottom edge, lateral edges and a top edge. The bottom edge of the quartz barrier sealingly engages the bottom of the crucible. Portions of the lateral edges of the quartz barrier sealingly engage the side members of the crucible. The top edge of the barrier extends above the level of the molten silicon which is adapted to be contained therein. Aperture means consisting of cut-out sections are provided in the lateral edge means of the barrier so as to form apertures of predetermined dimensions of which portions of the side walls of the crucible are a part. The aperture means are positioned a predetermined distance above the bottom of the crucible to cause silicon which is first melted approximate the bottom and side portions of the crucible to pool at the heated bottom portion of the silicon replenishment section to prevent silicon from passing directly upon melting into the dendritic web drawing section. The aperture means are also positioned a predetermined distance beneath the level of molten silicon and the web drawing section to prevent unmelted silicon supported upon the molten silicon from passing from the silicon melt replenishment section of the crucible and into the web drawing section. The dimensions of the aperture in the quartz barrier are sufficient to pass at least a predetermined flow of silicon to the web drawing section to provide an adequate flow of melted silicon. The positioning of the apertures in the barrier adjacent the side portions of the crucible cause the molten silicon to pass into the web drawing section proximate the heated side walls of the crucible to insure that the silicon is at an adequate temperature to draw silicon dendritic web.

BRIEF DESCRIPTION OF THE DRAWINGS

For a better understanding of the invention, reference may be had to the preferred embodiments, exemplary of the invention, shown in the accompanying drawings, in which.

DESCRIPTION OF THE PREFERRED EMBODIMENTS

Figure 1:
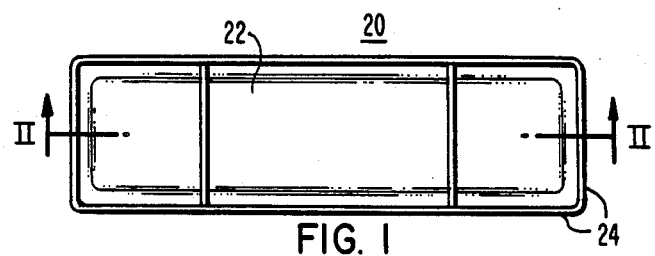
FIG. 1 is a plan view of a quartz crucible which incorporates improved barriers of the present invention.
Figure 2:
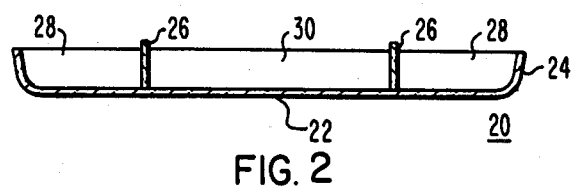
FIG. 2 is a sectional view taken on the line II—II in FIG. 1 in the direction of the arrows.
Figure 3:
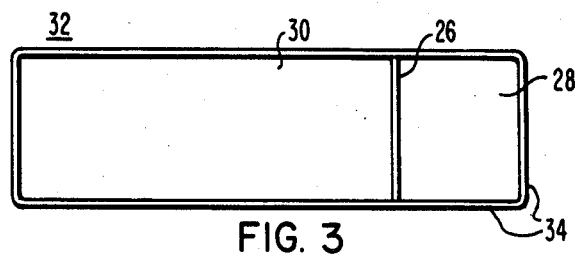
FIG. 3 is a plan view of an alternative quartz crucible which has vertical sides and which incorporates only a single barrier constructed in accordance with the present invention.

With specific reference to the form of the invention illustrated in the drawings, numeral 20 in FIGS. 1 and 2 is an elongated quartz crucible means having a closed bottom portion 22 and side members 24 extending upwardly therefrom with the top portion of the crucible being at least partially open. As shown in the sectional view in FIG. 2, quartz barrier means 26 are laterally disposed within the crucible 20 to define therein silicon melt replenishment section means 28 and a separate dendritic web drawing section 30. An alternative embodiment of a crucible 32 is shown in FIG. 3 wherein only one barrier 26 is utilized to form one dendritic web drawing section 30 and one silicon melt replenishment section 28. Also in this embodiment, the sides 34 of the crucible 32 are vertically disposed.

Figure 4:
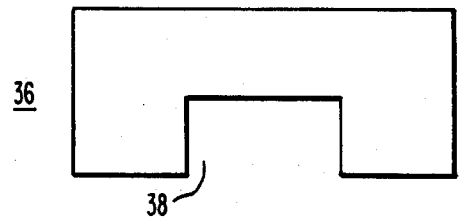
FIG. 4 is an elevational view of one type of prior art barrier.
Figure 5:
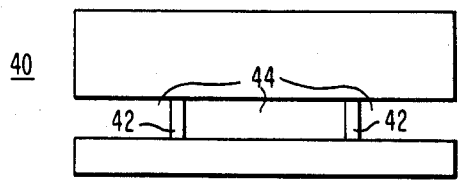
FIG. 5 is an elevational view of another type of prior art barrier.
Figure 6:
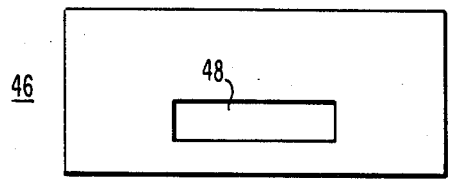
FIG. 6 is an elevational view of still another type of prior art barrier.

In FIGS. 4–6 are shown elevational views of prior art quartz barrier members. The barrier member 36 of FIG. 4 is provided with one cut-out section 38 at the bottom portion thereof. With such an embodiment, the silicon which is initially melted proximate the bottom of the crucible would flow immediately into the web drawing section which would create undesirable thermal gradients through the web drawing section.

Another prior art embodiment 40, shown in FIG. 5, is formed as a four piece barrier with two small upstanding sections 42 connecting the bottom section and the top section. With this embodiment, considerable flow occurs through the midpoint of the formed apertures 44 and there will be thermal gradients formed in the web drawing section due to silicon introduction through the outermost apertures and the center aperture. In addition, the fusion joined portions of the upstanding sections 42 were subject to premature failure.

In FIG. 6 is shown still another prior-art barrier embodiment 46 which contains only one aperture 48 of rectangular configuration spaced slightly above the bottom of the crucible. Such an embodiment permitted flow only through the center section of the barrier which created some physical perturbance as well as thermal problems and, in addition, it was extremely expensive to manufacture such an embodiment.

Figure 7:
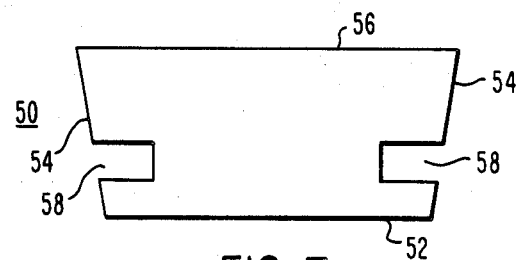
FIG. 7 is an elevational view of one embodiment of a quartz barrier of the present invention.

In FIG. 7 there is shown a barrier means 50 constructed in accordance with the present invention. This barrier means has a predetermined configuration comprising a bottom edge means 52, lateral edge means 54 and a top edge means 56. The bottom edge sealingly engages the bottom 22 of the crucible 20, see FIGS. 1 and 2. Portions of the lateral edges 54 are fused to and sealingly engage the side members 24 of the crucible. The top edge 56 of the barrier extends above the level of molten silicon which is adapted to be contained within the quartz crucible 20.

In accordance with the present invention, aperture means 58 consisting of cut-out sections are provided in the lateral edges 54 so as to form apertures of predetermined dimensions with portions of the side walls 24 of the crucible 20, see FIGS. 1 and 2. The apertures 58 are positioned a predetermined distance above the bottom of the crucible to cause silicon which is first melted proximate the bottom and side portions of the crucible 20 to pool at the heated bottom portion of the silicon replenishment sections 28 (see FIGS. 1 and 2) of the crucible and to prevent the silicon from passing directly upon melting into the dendritic web drawing section 30 until a predetermined pool depth is reached. The aperture means 58 are also positioned a predetermined distance beneath the predetermined level of molten silicon in the silicon melt replenishment section of the crucible to prevent unmelted silicon which is supported upon the molten silicon within the crucible from passing from the silicon melt replenishment section of the crucible into the web drawing section thereof.

The dimensions of the aperture 58 in the barrier are sufficient to pass at least a predetermined flow of silicon to the web drawing section to provide an adequate flow of melted silicon into the web drawing section and the positioning of the apertures in the barrier adjacent the side portions 24 of the crucible 20 causes the molten silicon to pass into the web drawing section proximate the heated side walls of the crucible to insure that the silicon is at an adequate temperature to draw the silicon dendritic web.

The barriers may be made from a rectangular or trapezoidal block of quartz having the same width and height as the finished barrier but being much longer than a single barrier is thick. The cut-outs in the lateral edges of the barrier may be machined in the sides of the quartz block in the form of grooves. Barriers can then be sliced off the block one at a time by means of a saw or otherwise.

Figure 8:
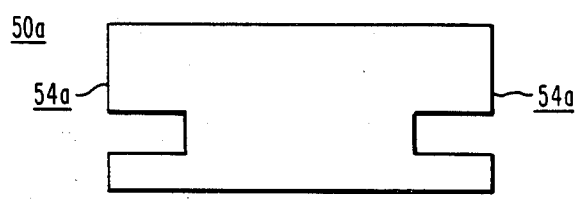
FIG. 8 is an elevational view of another embodiment of a quartz barrier constructed in accordance with the present invention.

The embodiment 50a in FIG. 8 is essentially identical to that shown in FIG. 7 except that the sides 54a of the barrier are vertical and are adapted to be incorporated into the crucible shown in FIG. 3.

As a specific example, the crucibles have a length of 8.0 inches (20.3 cm), a width of 2.5 inches (6.4 cm) and are adapted to contain molten silicon at a depth of 0.6 inch (1.5 cm). For such an embodiment, each of the apertures 58 are provided with a cross sectional area of 0.059 in.$^2$ (0.38 cm$^2$).

Figure 9:
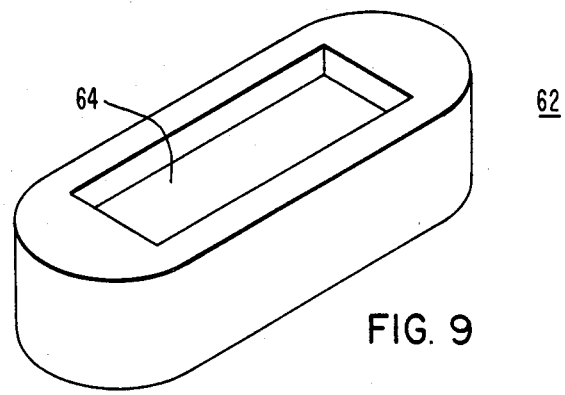
FIG. 9 is an isometric view of the susceptor member which is used in conjunction with the present apparatus.
Figure 10:
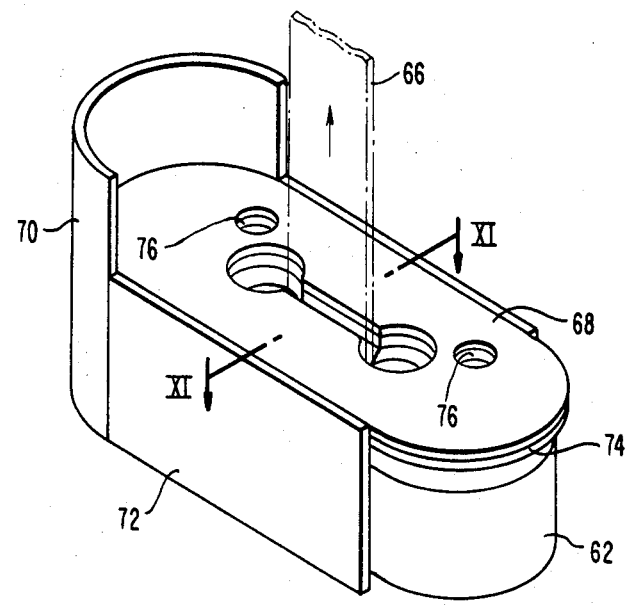
FIG. 10 is an isometric view of an operating susceptor showing the silicon dendritic web being pulled therefrom in phantom view.

FIG. 9 illustrates an isometric view of a conventional susceptor 62 which is adapted to operate with the present improved barrier-crucible. The crucible is adapted to fit into the aperture 64 which is provided at the top of the susceptor. A quartz crucible incorporated into a susceptor 62 is shown in isometric view in FIG. 10 with the silicon dendritic web 66 being drawn through a cover member 68 provided over the susceptor 62. To complete the description, the member 70 is an end heat shield, the member 72 is a side heat shield and the cover has heat shields 74 disposed therebeneath. For operation with this embodiment, two of the present improved barrier members are utilized and a melt replenishment section is provided at both ends of the crucible with the apertures 76 being provided through all cover members to furnish replenishment silicon.

Figure 11:
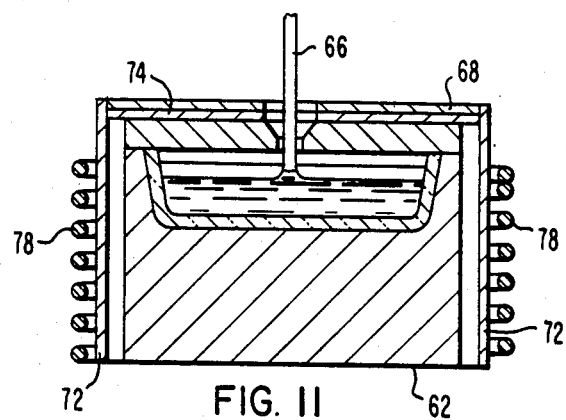
FIG. 11 is a sectional elevation taken on the line XI—XI in FIG. 10.

The sectional elevation in FIG. 11 shows the drawing operation in more detail and the susceptor 62 is adapted to be inductively heated by coils 78. The susceptor is preferably fabricated of molybdenum as is the top cover 68 of the susceptor. It should be pointed out that essentially all of this apparatus is generally conventional except for the improved crucible and barrier arrangement.

Figure 12:
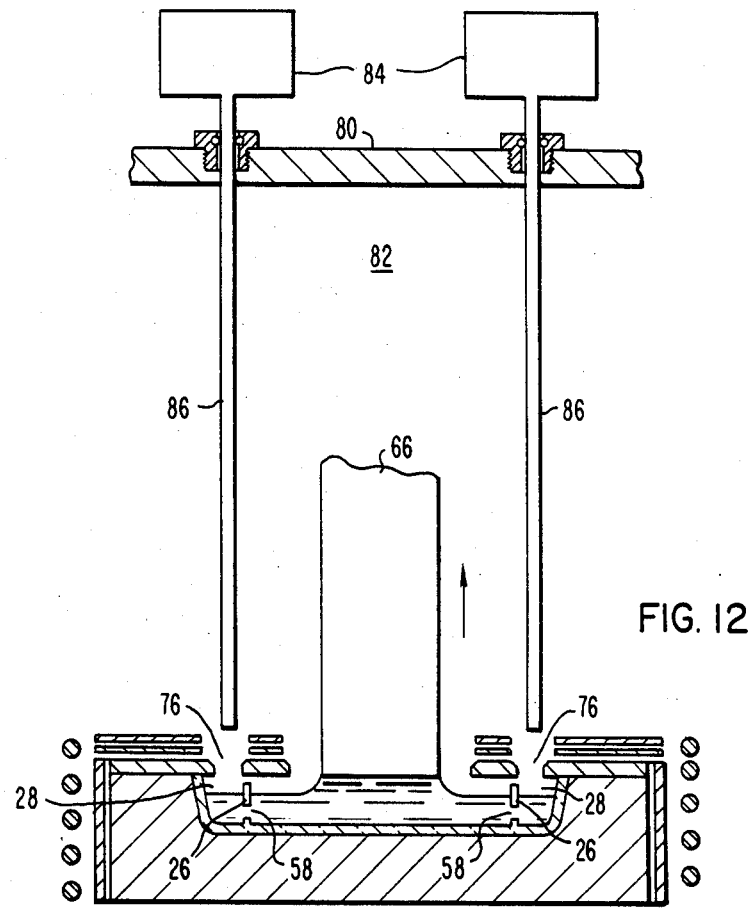
FIG. 12 is a sectional elevation showing the operating apparatus together with the unmelted silicon replenishment system.

FIG. 12 is a sectional elevation depicting a further embodiment of the apparatus wherein a top cover member 80 which forms a part of the growth chamber 82 has apertures provided through the top portion thereof for feeding unmelted silicon from reservoirs 84 through feed tubes 86 and through the apertures 76 which feed into the silicon replenishment sections 28. The silicon web 66 as it is drawn is continuous and with the present improved construction, webs of substantial lengths have been drawn. As is conventional, the growth chamber 82 contains an inert atmosphere such as argon at slightly above atmospheric pressure.

I claim:

1. In combination with an apparatus for drawing dendritic silicon web from a silicon melt, said apparatus comprising an elongated quartz crucible means having a closed bottom portion and side members extending upwardly therefrom to form a top portion of said crucible means, the top portion being at least partially open, quartz barrier means laterally disposed within said crucible means to define therein silicon melt replenishment section means and a separate dendritic web drawing section, heating means to heat the bottom portion and side members of said crucible means to melt silicon therein and to retain a predetermined level of silicon in the molten state in the web drawing section of said crucible means, means for drawing dendritic silicon web at a predetermined rate from the molten surface of said silicon contained within the web drawing section of said crucible means, and silicon replenishment means for adding unmelted silicon at a predetermined rate to said silicon melt replenishment section means of said crucible means;

wherein an improved quartz barrier means for thermally isolating the dendritic web drawing section from the melt replenishment section means for permitting continuous replacement of the silicon drawn from the dendritic web drawing section as silicon dendritic web without interrupting web drawing comprising:

said improved barrier means having a predetermined configuration comprising bottom edge means and lateral edge means and top edge means, the bottom edge means of said quartz barrier means sealingly engaging the bottom portion of said crucible means, portions of the lateral edge means of said quartz barrier means sealingly engaging the side members of said crucible means, and the top edge means of said barrier means extending above the level of molten silicon adapted to be contained in said crucible means;

aperture means consisting of cut-out sections provided only in the lateral edge means of said barrier means to form apertures of predetermined dimensions with portions of the side walls of said crucible means, the lateral edge means sealingly engaging the side members of said crucible means along the entire length of the lateral edge means excepting the sections of the lateral edge means cut-out to form the apertures, said improved quartz barrier means permitting flow of molten silicon from the melt replenishment section means into the dendritic web drawing section only through the apertures in the lateral edge means of said barrier means, said barrier means prohibiting passage of molten silicon from the melt replenishment section means into the web drawing section except through the aperture means;

the aperture means positioned a predetermined distance above the bottom portion of said crucible means to cause silicon which is first melted proximate the bottom portion and side members of said crucible means to pool at the heated bottom portion of the silicon replenishment section means of said crucible means and to prevent said silicon from passing directly upon melting into the dendritic web drawing section until a predetermined pool depth is reached, the aperture means also positioned a predetermined distance beneath the predetermined level of molten silicon in the melt replenishment section means of said crucible means to prevent unmelted silicon supported upon the molten silicon in the silicon melt replenishment section means from passing into the web drawing section of said crucible means; and the dimensions of the aperture means in said quartz barrier means being sufficient to pass at least an adequate flow of melted silicon into said web drawing section, and the positioning of the aperture means in said barrier means adjacent the side portions of said crucible means causing the molten silicon to pass into the web drawing section only proximate the heated side members of said crucible means to cause the molten silicon to be heated by the heated side members prior to passing into the web drawing section to insure that said silicon is at an adequate temperature for drawing silicon dendritic web and to prevent a thermal unbalance in the dendritic web drawing section by preventing silicon from passing into the web drawing section at a temperature not sufficiently high for web drawing.

2. The combination as specified in claim 1, wherein a single quartz barrier is utilized to define within said crucible means a single web drawing section and a single melt replenishment section.

3. The combination as specified in claim 1, wherein two quartz barriers are utilized to define within said crucible means a single web drawing section proximate the center of said crucible means and two silicon melt replenishment sections proximate the end portions of said elongated crucible means.

4. The combination as specified in claim 1, wherein said apparatus is enclosed by a growth chamber which is capable of retaining an inert gas atmosphere.

5. In combination with an apparatus for drawing dendritic silicon web from a silicon melt, said apparatus comprising an elongated quartz crucible means having a closed bottom portion and having side members and end portions extending upwardly therefrom, two quartz barriers laterally disposed within said crucible means to define therein two silicon melt replenishment sections, one silicon melt replenishment section being adjacent one end portion of said crucible means and the other silicon melt replenishment section being adjacent the other end portion of said crucible means, and a separate dendritic web drawing section positioned between the silicon melt replenishment sections and operative to retain a pool of molten silicon of a predetermined level, heating means adapted to heat the bottom portion, end portions, and side member of said crucible means to melt silicon therein, dendritic web drawing means for drawing dendritic silicon web at a predetermined rate from near the center of the molten pool contained within the web drawing section, silicon melt replenishment means for adding unmelted silicon at a predetermined rate to the silicon melt replenishment sections, the predetermined rate of silicon addition corresponding to the predetermined rate at which silicon is drawn out of the crucible means to replace the silicon removed from said crucible means as dendritic web; improved quartz barriers for thermally and physically isolating the silicon melt replenishment sections from the dendritic web drawing section to permit continuous drawing of silicon dendritic web from said crucible means comprising:

each of said improved barriers consisting of a single piece of quartz having a predetermined configuration comprising a bottom edge, lateral edges, and a top edge, the bottom edge of said quartz barrier sealingly engaging the bottom portion of said crucible means and the top edge of said barrier extending above the predetermined level of molten silicon adapted to be contained in the web drawing section:

each of said improved barriers having an aperture consisting of a cut-out section in each of the lateral edges through which silicon melted in the melt replenishment sections can pass into the web drawingn section, flow of silicon from the melt replenishment sections into the web drawing section being prohibited except through the apertures, the lateral edges of the barriers sealingly engaging the side members of said crucible means except along the sections where the lateral edges are cut-out to form apertures;

each aperture being positioned a predetermined distance above the bottom edge of the barrier means to cause silicon which is first melted proximate the bottom, end, and side portions of said crucible means to pool at the heated bottom portion of the silicon melt replenishment sections and to prevent silicon from passing into the web drawing section until silicon has pooled in the melt replenishment sections at a predetermined pool depth;

each aperture being positioned a predetermined distance beneath the predetermined level of molten silicon which pools in the melt replenishment sections to prevent unmelted silicon supported upon the molten silicon in the silicon melt replenishment sections from passing into the web drawing section;

the apertures being of sufficient size to pass at least an adequate flow of melted silicon into the web drawing section to replace the silicon withdrawn from the web drawing section in web form, and the positioning of the apertures adjacent the heated side members of said crucible means causing the molten silicon in the melt replenishment sections to pass into the web drawing section only proximate the heated side members of said crucible means to cause the molten silicon to be heated by the heated side members prior to passing into the web drawing section to insure that said silicon is at an adequate temperature for drawing said dendritic silicon web, to prevent a thermal unbalance in the dendritic web drawing section by preventing silicon from passing into the web drawing section at a temperature not sufficiently high for web drawing, and to prevent physical perturbation of the center of the web drawing section to enable continuous drawing of dendritic web to provide continuous webs of substantial length.

6. An improved method for continuously drawing dendritic silicon web from a dendritic web drawing section of an elongated quartz crucible means having a closed bottom portion, two end portions, and two side members, the end portions and the side members being sealingly attached to the bottom portion and extending upwardly therefrom, the bottom portion, end portions, and side members being heated by a heating means, the silicon drawn off as web from the web drawing section being continuously replaced by additions of unmelted silicon into a melt replenishment section means of the crucible means, the melt replenishment means being physically and thermally separated from the web drawing section by improved quartz barrier means having lateral edges, a top edge, and a bottom edge, the improved quartz barrier means having aperture means for passing silicon melted in the melt replenishment section means into the web drawing section to replace silicon drawn off as web, the aperture means comprising apertures disposed only along the lateral edges of the barrier means a first predetermined distance above the bottom edge of the barrier means and a second predetermined distance below the top edge of the barrier means, the bottom edge of the barrier means sealingly engaging the bottom portion of the crucible means and the lateral edges of the barrier means sealingly engaging portions of the side members of the crucible means for prohibiting flow of molten silicon from the melt replenishment section means into the web drawing section except through the apertures, the improved method comprising:

drawing silicon dendritic web from the web drawing section of the quartz crucible means at a predetermined rate resulting in removal of a predetermined quantity of silicon from the crucible means, adding a predetermined amount of unmelted silicon to the silicon melt replenishment section means, the predetermined amount being substantially the same as the quantity removed by web drawing, melting the unmelted silicon in the melt replenishment section means, preventing silicon melted in the melt replenishment section means from flowing into the dendritic web drawing section except through the apertures disposed only along the lateral edges of the barrier means, permitting flow of silicon from the melt replenishment section means into the web drawing section only through the apertures in the lateral edges of the barrier means, the positioning of the apertures adjacent the heated side portions of the quartz crucible means causing the silicon melted in the melt replenishment section means to be heated before passing into the web drawing section by contact with the heated side members of the quartz crucible means, the positioning of the apertures a first predetermined distance above the bottom edge of the barrier means prohibiting silicon from passing into the web drawing section until a pool of molten silicon of a predetermined depth has formed in the melt replenishment section means, and the positioning of the apertures a second predetermined distance below to top edge of the barrier means causing the silicon to flow into the web drawing section at a third predetermined distance below the level of molten silicon in the melt replenishment section means so that unmelted silicon which is supported upon the molten silicon in the melt replenishment section means is prohibited from passing into the web drawing section by the barrier means, the positioning of the apertures only in the lateral edges of the barrier means a first predetermined distance above the bottom edge thereof and a second predetermined distance below the top edge thereof preventing thermal and physical disturbance of the web drawing section to enable continuous drawing of silicon dendritic web therefrom.

7. The improved method of claim 6, comprises melting in a silicon melt replenishment section means which comprises a single silicon melt replenishment section.

8. The improved method of claim 7 further comprises melting in a, silicon melt replenishment section means consists of two silicon melt replenishment sections, one silicon melt replenishment section located proximate a first end portion of the elongated crucible means and the other melt replenishment section located proximate the other end portion of the crucible means, the dendritic web drawing section located between the two melt replenishment sections, and the quartz barrier means comprises two quartz barriers, one quartz barrier separating the silicon melt replenishment section located proximate the first end of the crucible means from the web drawing section and the other quartz barrier separating the other silicon melt replenishment section located proximate the other end of the crucible means from the web drawing section.

9. The improved method of claim 6, wherein the heating steps further comprises providing a susceptor adapted to receive the quartz crucible means, the susceptor adapted to be inductively heated by heating coils.

10. The improved method according to claim 9, wherein the crucible means and susceptor are enclosed in a growth chamber and introducing an inert gas that is above atmospheric pressure.

* * * * *